United States Patent [19]
Myer

[11] Patent Number: 6,051,996
[45] Date of Patent: Apr. 18, 2000

[54] PHASE DETECTOR

[75] Inventor: Robert Evan Myer, Denville, N.J.

[73] Assignee: Lucent Technologies Inc., Murray Hill, N.J.

[21] Appl. No.: 09/164,535

[22] Filed: Sep. 30, 1998

[51] Int. Cl.[7] .................................................. H03K 5/26
[52] U.S. Cl. ................................. 327/3; 327/7; 327/231; 327/237; 327/248
[58] Field of Search ..................... 327/231, 233, 327/236, 237, 248, 3, 7, 10, 12, 359, 361

[56] References Cited

U.S. PATENT DOCUMENTS

| | | | |
|---|---|---|---|
| 4,048,580 | 9/1977 | Campbell et al. | 331/1 R |
| 5,381,444 | 1/1995 | Tajima | 375/1 |
| 5,400,363 | 3/1995 | Waugh et al. | 375/80 |

*Primary Examiner*—Tuan T. Lam

[57] ABSTRACT

The present invention is a method and an apparatus for measuring phase differences between signals A and B using an absolute voltage value for each phase difference between ±180°. This is accomplished using a third signal C, which is a signal having a phase approximately equal to the average phase between signals A and B. Signals C and A are subsequently amplitude limited and mixed to produce a fourth signal D, which is a signal having associated an absolute voltage value for each degree of phase difference between ±180° for signals A and B.

22 Claims, 3 Drawing Sheets

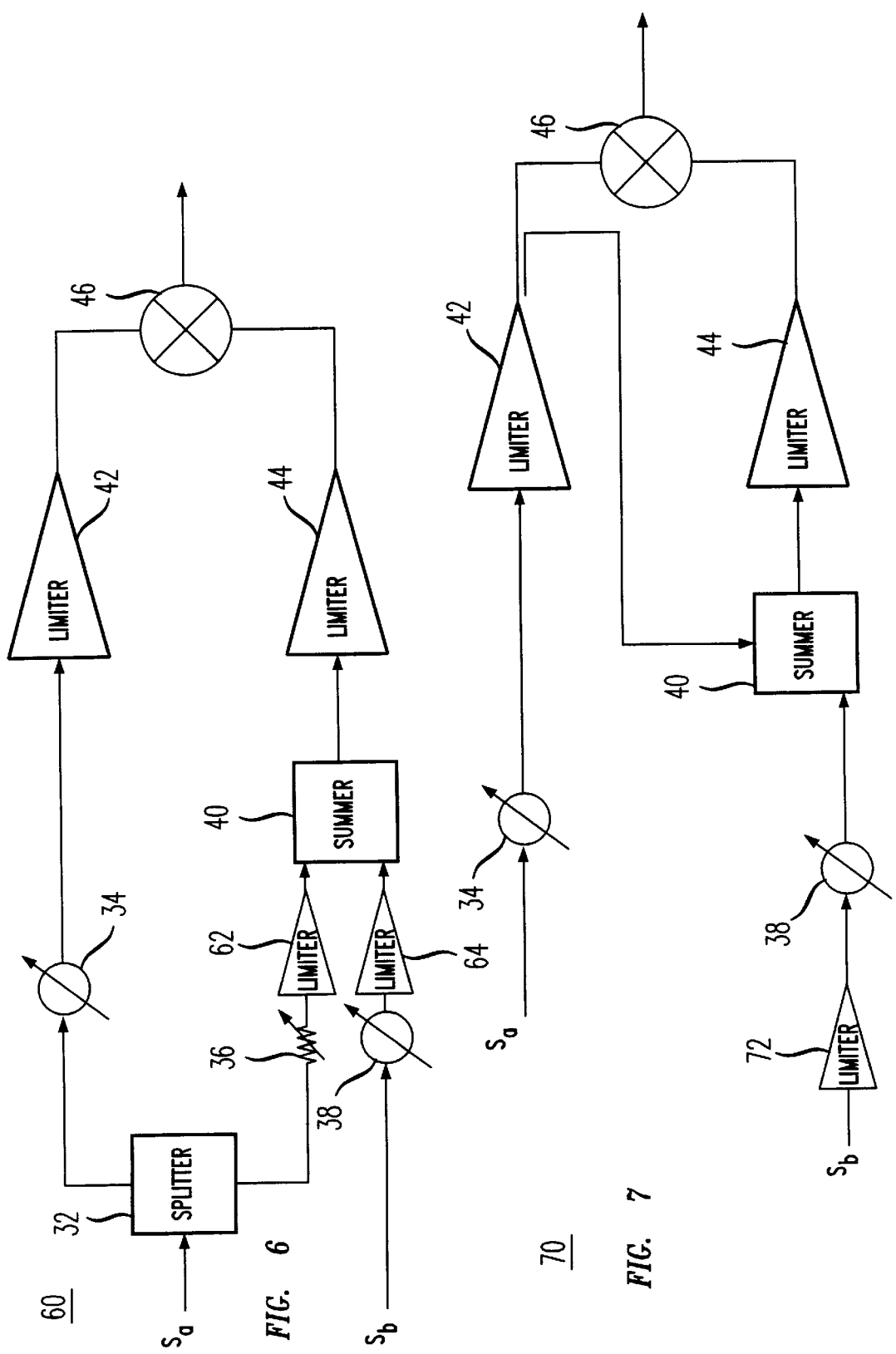

PHASE DETECTOR

FIELD OF THE INVENTION

The present invention relates generally to radio frequency (RF) circuitry, and more particularly to a phase detector for detecting the phase of an input signal.

BACKGROUND OF THE RELATED ART

A phase detector is a circuit or instrument for detecting a difference in phase between corresponding points on two signals. Ordinary phase detectors of radio frequency signals at 2 GHz use a mixer as a phase detector. FIG. 1 illustrates such a phase detector 10 comprising amplitude limiters 12, 14 and a mixer 16. Signals $S_a$ and $S_b$ are provided as inputs to amplitude limiters 12, 14, respectively. For purposes of illustration, signal $S_a$ is a 1.999 GHz signal and $S_b$ is a 2.000 GHz signal. Amplitude limiters 12, 14 saturate the amplitudes of signals $S_a$ and $S_b$ to produce output signals $S_{12}$ and $S_{14}$, thereby eliminating amplitude variations between signals $S_a$ and $S_b$. Note that signals $S_{12}$ and $S_{14}$ are signals representative of signals $S_a$ and $S_b$, respectively. Signals $S_{12}$ and $S_{14}$ are mixed by mixer 16 to produce output signal $S_{16}$. Since signals $S_{12}$ and $S_{14}$ have 360° of phase shift between them (i.e., $S_a$ is 1.999 GHz and $S_b$ is 2.000 GHz), mixer 16 will produce a sine wave output signal (i.e., signal $S_{16}$ is a sine wave output signal). See FIG. 2, which depicts a sine wave output signal 20.

Using the phase detector 10 of FIG. 1 (and other similar phase detectors) in a feedback system to control the phase of one or more signals has certain limitations. Particularly, the feedback system would be limited to detecting phase differences of ±90° because of direction reversal by signal $S_{16}$. For example, if signals $S_a$ and $S_b$ have a phase difference of +45° (indicated by point A), a voltage value of 0.5 is indicated. The +45° phase difference is indicated by point A on FIG. 2. At 90°, the direction of signal $S_{16}$ reverses and at a +135° phase difference between signals $S_a$ and $S_b$ (indicated by point B), a voltage value of 0.5 is also indicated. Thus, the prior art phase detector 10 uses the same voltage value to indicate different phase differences. This, in effect, limits the range of phase detector 10 (and the feedback system) to ±90°.

In some instances, a feedback system incorporating the phase detector 10 of FIG. 1 (and other similar phase detectors) is sufficient for detecting phase differences between two signals if the phase differences should be within ±90°. However, in instances where the phase differences between two signals to be phase detected will be beyond ±90°, e.g., 135°, such phase detector 10 (or equivalents) will be inadequate since a same voltage value may indicate multiple phase differences. The ideal phase detector should be monotonic for measuring phase differences within a range of ±180°. That is, the ideal phase detector should indicate an absolute voltage value for each phase difference between ±180°. Accordingly, there exists a need for such a phase detector.

SUMMARY OF THE PRESENT INVENTION

The present invention is a method and an apparatus for measuring phase differences between signals A and B using an absolute voltage value for each phase difference between ±180°. The present invention uses a third signal C derived from summing approximately equal amplitude signals representative of signals A and B. Thus, signal C is a signal having a phase approximately equal to the average phase between signals A and B. In one embodiment, signals C and A are subsequently amplitude limited and mixed to produce a fourth signal D, which is a signal having associated an absolute voltage value for each degree of phase difference between ±180° for signals A and B.

BRIEF DESCRIPTION OF THE DRAWINGS

The features, aspects, and advantages of the present invention will become better understood with regard to the following description, appended claims, and accompanying drawings where:

FIGS. 6 and 7 depict phase detectors in accordance other embodiments of the present invention.

DETAILED DESCRIPTION

Figure 2:
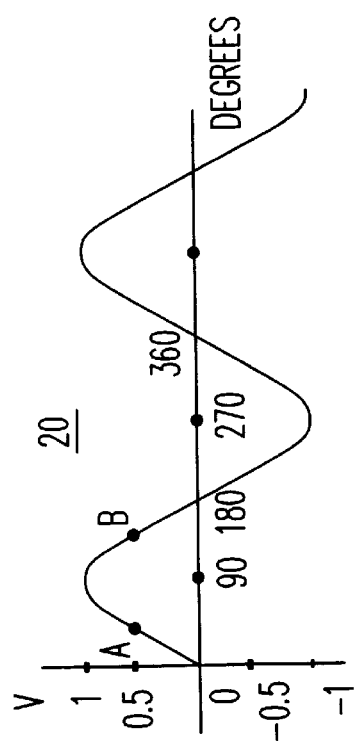
FIG. 2 depicts a waveform of an output signal of the phase detector of FIG. 1 when the frequency of the input signals are 1.999 GHz and 2.000 GHz.
Figure 1:
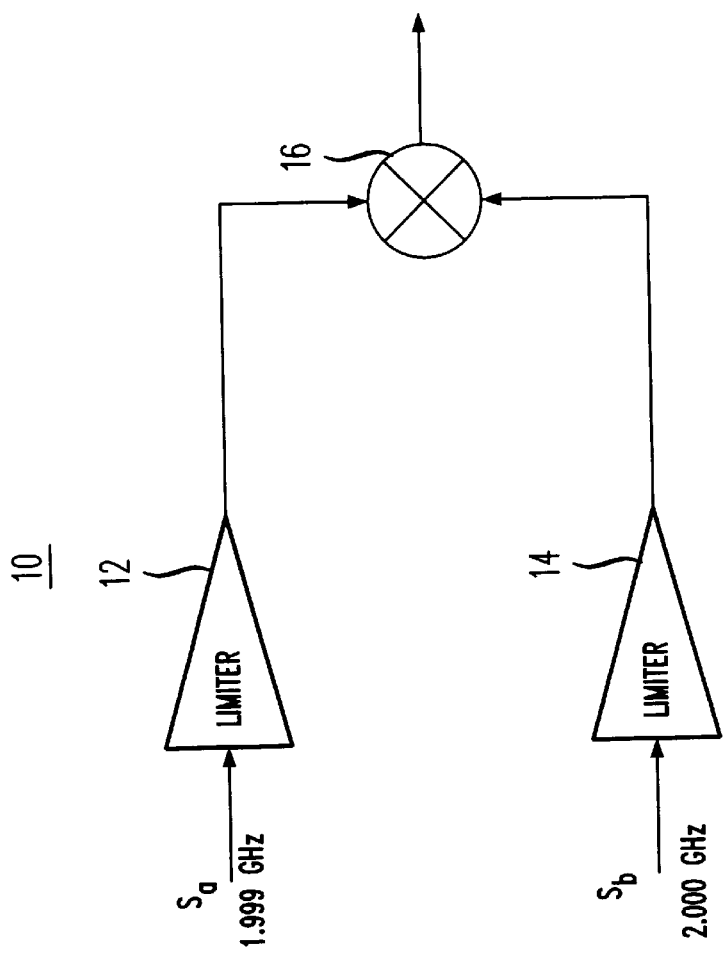
FIG. 1 depicts a block diagram of a phase detector in the prior art.
Figure 3:
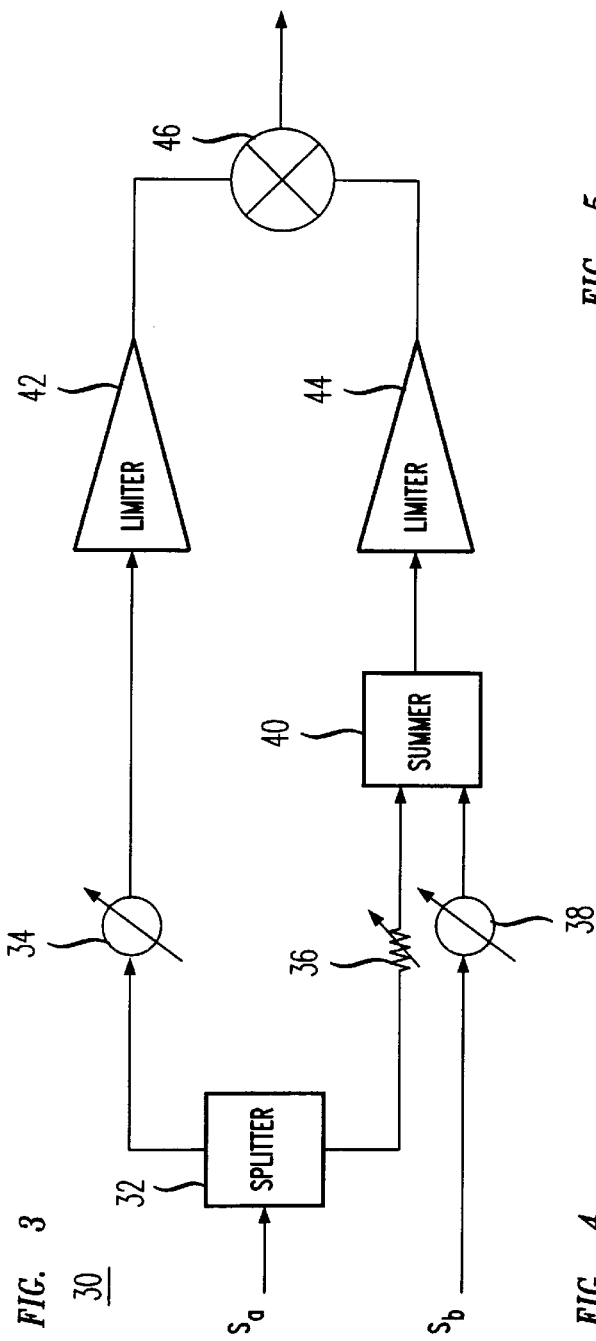
FIG. 3 depicts a block diagram of an improved phase detector in accordance with one embodiment of the present invention.

FIG. 3 depicts an improved phase detector 30 in accordance with one embodiment of the present invention. The phase detector 30 comprises splitter (or directional coupler) 32, phase shifters 34, 38, an attenuator 36, summer 40, amplitude limiters 42, 44 and a mixer 46. Signals $S_a$ and $S_b$ are provided as inputs to splitter 32 and phase adjuster 38, respectively. Splitters, phase shifters, attenuators, summers, amplitude limiters and mixers are all well-known in the art. For purposes of illustration, signal $S_a$ is a 1.999 GHz signal and $S_b$ is a 2.000 GHz signal. This should not, however, be construed to limit the present invention in any manner.

Splitter produces and directs signals $S_{32-1}$ and $S_{32-2}$ to phase adjuster 34 and attenuator 36, respectively. For purposes of this application, the term splitter and directional coupler (along with their functionality) shall be construed to be interchangeable with each other. Signals $S_{32-1}$ and $S_b$ are phase shifted by phase adjusters 34 and 38 to produce output signals $S_{34}$ and $S_{38}$, which are phase shifted signals representative of signals $S_a$ and $S_b$, respectively. Signals $S_{34}$ and $S_{38}$ should have approximately identical phases. Signals $S_{32-1}$ and $S_b$ are phase shifted for purposes of producing an absolute voltage relationship corresponding to the phase relationship between signals $S_a$ and $S_b$. For example, phase adjusters 34 and 38 are used to set an absolute voltage of 0 volts in order to indicate a 0° phase difference between signals $S_a$ and $S_b$. Note that if an absolute voltage relationship need not be shown between signals $S_a$ and $S_b$, then phase adjusters 34 and 38 are not required.

The amplitude of signal $S_{32-2}$ is adjusted by attenuator 36 to produce signal $S_{36}$, which is an attenuated (or amplitude adjusted) signal representative of signal $S_{32-2}$. Signal $S_{32-2}$ is attenuated such that signal $S_{36}$ has approximately the same amplitude as signal $S_b$. Signals $S_{36}$ and $S_{38}$ are provided as inputs to summer 40 to produce resultant signal $S_{40}$, which is a signal having a phase approximately equal to the average phase of signals $S_{36}$ and $S_{38}$. If the amplitude of signal $S_{32-2}$ was not attenuated such that signal $S_{36}$ has approximately the same amplitude as signal $S_{38}$, the phase of resultant signal $S_{40}$ would more closely approximate the phase of whichever signal (i.e., $S_{36}$ or $S_{38}$) has the larger (absolute) amplitude. In an alternate embodiment, signal $S_{38}$ (or $S_b$) can be attenuated to match the amplitude of signal $S_{32\text{-}2}$.

Figure 4:
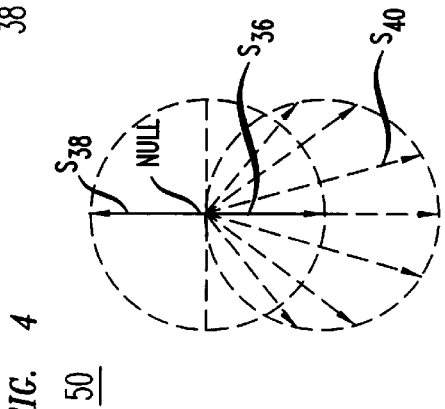
FIG. 4 depicts a vector diagram for signals $S_{36}$ and $S_{38}$ and a vector diagram for resultant signal $S_{40}$.

FIG. 4 depicts a vector diagram 50 for signals $S_{36}$ and $S_{38}$ and a vector diagram 52 for resultant signal $S_{40}$ (represented by a plurality of dashed vectors corresponding to the phase relationship between signals $S_{36}$ and $S_{38}$). At $\pm 180°$ phase difference between signals $S_{36}$ and $S_{38}$, the phase of signals $S_{40}$ is null. As the phase of signal $S_{38}$ shifts clockwise with respect to signal $S_{36}$, the phase of signal $S_{40}$ shifts from $-180°$ to $+180°$. Note that at $+180°$, the phase of signal $S_{40}$ jumps to $-180°$.

The amplitudes of signals $S_{34}$ and $S_{40}$ are saturated by amplitude limiters 42 and 44 to produce signals $S_{42}$ and $S_{44}$, which are amplitude limited signals representative of signals $S_{34}$ and $S_{40}$, respectively. Amplitude limiters 42 and 44 should have approximately the same boundary value such that the amplitude variations in signals $S_{34}$ and $S_{40}$ may be eliminated, thereby leaving only the phase information in output signals $S_{42}$ and $S_{44}$.

Signal $S_{44}$ is mixed with signal $S_{42}$ by mixer 46 to produce resultant signal $S_{46}$, which is a signal indicative of the phase relationship between signals $S_a$ and $S_b$. For each phase relationship between $\pm 180°$, signal $S_{46}$ has associated an absolute voltage value. Unlike prior art phase detectors where a voltage value may indicate two phase relationships, the present invention phase detector is monotonic—that is, a voltage value may indicate only one phase relationships between $\pm 180°$.

Figure 5:
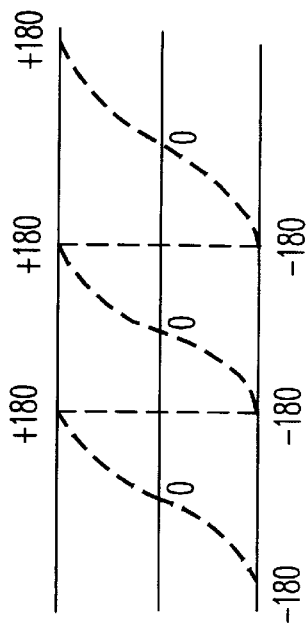
FIG. 5 depicts a waveform for an output signal of the phase detector in accordance with one embodiment of the present invention when the frequency of the input signals are 1.999 GHz and 2.000 GHz.

FIG. 5 depicts a waveform 52 for signal $S_{46}$ when signal $S_a$ is a 1.999 GHz signal and $S_b$ is a 2.000 GHz signal. Waveform 52 (or signal $S_{46}$) curves upward from $-180°$ to $+180°$. Each degree of the phase relationship between signals $S_a$ and $S_b$ is associated with an absolute voltage value. Preferably, phase adjusters 34 and 38 are set to shift the phases for signals $S_a$ (or $S_{32\text{-}1}$) and $S_b$ such that signal $S_{46}$ has a zero voltage value when signals $S_a$ and $S_b$ are in-phase (i.e., 0° phase difference). Note that at $+180°$, the waveform for signal $S_{46}$ flips to $-180°$ and starts curving upwards again. Thus, no single voltage value will indicate multiple phase relationships between signals $S_a$ and $S_b$.

Although the present invention has been described in considerable detail with reference to certain embodiments, other versions are possible. For example, see FIGS. 6 and 7. As shown in FIG. 6, the signals $S_{36}$ and $S_{38}$ are amplitude limited (to the same amplitude) before being provided as inputs to summer 40. As shown in FIG. 7, signal $S_{38}$ is amplitude limited and signal $S_{42}$ is split by a splitter (before being provided to summer 40). Therefore, the spirit and scope of the present invention should not be limited to the description of the embodiments contained herein.

What is claimed is:

1. A method of detecting a phase relationship between two signals comprising the steps of:

splitting a first input signal to produce a first split signal having an amplitude and a second split signal having an amplitude;

adjusting the amplitude of the first split signal to produce a first amplitude adjusted split signal having an amplitude;

adjusting the amplitude of the second split signal to produce a second amplitude adjusted split having an amplitude;

summing a second input signal having an amplitude and the second amplitude adjusted split signal to produce a summed signal having an amplitude, the amplitude of the second amplitude adjusted split signal being approximately equal to the amplitude of the second input signal;

adjusting the amplitude of the summed signal to produce an amplitude adjusted summed signal having an amplitude approximately equal to the amplitude of the first amplitude adjusted split signal; and mixing the first amplitude adjusted split signal with the amplitude adjusted summed signal to produce a mixed signal.

2. The method of claim 1 comprising the additional step of:

shifting a phase of the first split signal to be approximately identical to a phase of the second input signal.

3. The method of claim 1 comprising the additional step of:

shifting a phase of the second input signal to be approximately identical to a phase of the first split signal.

4. The method of claim 1 comprising the additional step of:

shifting one or more phases of the second input signal and the first split signal to produce an absolute voltage relationship corresponding to a phase relationship between the first and second input signals.

5. The method of claim 4, wherein a zero voltage value indicates a 0° phase difference between the first and second input signals.

6. The method of claim 1, wherein the amplitude of the first split signal is adjusted using an amplitude limiter.

7. The method of claim 1, wherein the amplitude of the second split signal is adjusted using an amplitude limiter.

8. The method of claim 1, wherein the amplitude of the second split signal is adjusted using an attenuator.

9. The method of claim 1, wherein the amplitude of the summed signal is adjusted using an amplitude limiter.

10. The method of claim 1 comprising the additional step of:

adjusting the amplitude of the second input signal to be approximately equal to the amplitude of the second amplitude adjusted split signal.

11. A method of detecting a phase relationship between two signals comprising the steps of:

splitting a first input signal to produce a first split signal having an amplitude and a second split signal having an amplitude;

adjusting the amplitude of the first split signal to produce a first amplitude adjusted split signal having an amplitude;

adjusting an amplitude of a second input signal to produce an amplitude adjusted second input signal having an amplitude approximately equal to the amplitude of the second split signal;

summing the amplitude adjusted second input signal and the second split signal to produce a summed signal having an amplitude;

adjusting the amplitude of the summed signal to produce an amplitude adjusted summed signal having an amplitude approximately equal to the amplitude of the first amplitude adjusted split signal; and mixing the first amplitude adjusted split signal with the amplitude adjusted summed signal to produce a mixed signal.

12. The method of claim 11 comprising the additional step of:

shifting a phase of the first split signal to be approximately identical to a phase of the second input signal.

13. The method of claim 11 comprising the additional step of:

shifting a phase of the second input signal to be approximately identical to a phase of the first split signal.

14. The method of claim 11 comprising the additional step of:

shifting one or more phases of the second input signal and the first split signal to produce an absolute voltage relationship corresponding to a phase relationship between the first and second input signals.

15. The method of claim 14, wherein a zero voltage value indicates a 0° phase difference between the first and second input signals.

16. A phase detector comprising:

a splitter for splitting a first input signal into a first split signal having an amplitude and a second split signal having an amplitude;

a first amplitude limiter for saturating the amplitude of the first split signal to produce a first amplitude adjusted split signal;

an attenuator for adjusting the amplitude of the second split signal to produce a second amplitude adjusted split signal having an amplitude;

a summer for summing the second amplitude adjusted split signal and a second input signal to produce a summed signal having an amplitude;

a second amplitude limiter for saturating the amplitude of the summed signal to produce an amplitude adjusted summed signal, the first and second amplitude limiter having an approximate identical boundary value; and a mixer for mixing the amplitude adjusted summed signal with the first amplitude adjusted split signal.

17. The phase detector of claim 16 further comprising:

a phase adjuster for shifting a phase of the first split signal to be approximately identical to a phase of the second input signal.

18. The phase detector of claim 16 further comprising:

a phase detector for shifting a phase of the second input signal to be approximately identical to a phase of the first split signal.

19. The phase detector of claim 16, wherein the attenuator is set to adjust the amplitude of the second split signal to be approximately equal to an amplitude of the second input signal.

20. A phase detector comprising:

a splitter for splitting a first input signal into a first split signal having an amplitude and a second split signal having an amplitude;

a first amplitude limiter for saturating the amplitude of the first split signal to produce a first amplitude adjusted split signal;

a second amplitude limiter for saturating the amplitude of the second split signal to produce a second amplitude adjusted split signal having an amplitude;

a third amplitude limiter for saturating an amplitude of a second input signal to produce an amplitude adjusted second input signal having an amplitude, the second and third amplitude limiters having an approximate identical boundary value;

a summer for summing the second amplitude adjusted split signal and the amplitude adjusted second input signal to produce a summed signal having an amplitude;

a fourth amplitude limiter for saturating the amplitude of the summed signal to produce an amplitude adjusted summed signal; and a mixer for mixing the amplitude adjusted summed signal with the first amplitude adjusted split signal.

21. The phase detector of claim 20 further comprising:

a phase adjuster for shifting a phase of the first split signal to be approximately identical to a phase of the second input signal.

22. The phase detector of claim 20 further comprising:

a phase detector for shifting a phase of the second input signal to be approximately identical to a phase of the first split signal.

* * * * *